United States Patent
Kuo et al.

(10) Patent No.: US 12,170,199 B2
(45) Date of Patent: *Dec. 17, 2024

(54) CYCLIC SPIN-ON COATING PROCESS FOR FORMING DIELECTRIC MATERIAL

(71) Applicant: Taiwan Semiconductor Manufacturing Co., Ltd., Hsinchu (TW)

(72) Inventors: Je-Ming Kuo, Hsinchu (TW); Yen-Chun Huang, New Taipei (TW); Chih-Tang Peng, Zhubei (TW); Tien-I Bao, Taoyuan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/362,136

(22) Filed: Jul. 31, 2023

(65) Prior Publication Data

US 2023/0411150 A1    Dec. 21, 2023

Related U.S. Application Data

(63) Continuation of application No. 17/813,968, filed on Jul. 21, 2022, now Pat. No. 11,791,154, which is a
(Continued)

(51) Int. Cl.
*H01L 21/02* (2006.01)
*B05D 3/06* (2006.01)
(Continued)

(52) U.S. Cl.
CPC ........ *H01L 21/02282* (2013.01); *B05D 3/067* (2013.01); *B05D 7/546* (2013.01);
(Continued)

(58) Field of Classification Search
CPC .......... B05D 1/002; B05D 1/005; B05D 1/38; B05D 3/067; B05D 7/546; G03F 7/162;
(Continued)

(56) References Cited

U.S. PATENT DOCUMENTS 6,727,184 B1 * 4/2004 Wang ................ H01L 21/76828
                                                        438/782
7,557,035 B1    7/2009 Ryan et al.
(Continued)

FOREIGN PATENT DOCUMENTS

TW    200947613 A    11/2009
TW    201222668 A    6/2012
TW    201616641 A    5/2016

*Primary Examiner* — Brian K Talbot
(74) *Attorney, Agent, or Firm* — Slater Matsil, LLP

(57) ABSTRACT

The present disclosure is generally related to semiconductor devices, and more particularly to a dielectric material formed in semiconductor devices. The present disclosure provides methods for forming a dielectric material layer by a cyclic spin-on coating process. In an embodiment, a method of forming a dielectric material on a substrate includes spin-coating a first portion of a dielectric material on a substrate, curing the first portion of the dielectric material on the substrate, spin-coating a second portion of the dielectric material on the substrate, and thermal annealing the dielectric material to form an annealed dielectric material on the substrate.

20 Claims, 7 Drawing Sheets

Related U.S. Application Data continuation of application No. 15/992,384, filed on May 30, 2018, now Pat. No. 11,450,526.

(51) Int. Cl.

| | | |
|---|---|---|
| *B05D 7/00* | (2006.01) | |
| *H01L 21/311* | (2006.01) | |
| *H01L 21/762* | (2006.01) | |
| *H01L 21/8234* | (2006.01) | |
| *H01L 29/06* | (2006.01) | |
| *B05D 1/00* | (2006.01) | |
| *B05D 1/38* | (2006.01) | |
| *G03F 7/16* | (2006.01) | |
| *H01L 21/768* | (2006.01) | |

(52) U.S. Cl.
CPC .. *H01L 21/02126* (2013.01); *H01L 21/02164* (2013.01); *H01L 21/0223* (2013.01); *H01L 21/02323* (2013.01); *H01L 21/02348* (2013.01); *H01L 21/31111* (2013.01); *H01L 21/76224* (2013.01); *H01L 21/823481* (2013.01); *H01L 29/0649* (2013.01); *B05D 1/005* (2013.01); *B05D 1/38* (2013.01); *G03F 7/162* (2013.01); *H01L 21/02255* (2013.01); *H01L 21/76825* (2013.01); *H01L 21/76826* (2013.01); *H01L 21/76828* (2013.01); *H01L 21/76832* (2013.01)

(58) Field of Classification Search
CPC ......... H01L 21/02282; H01L 21/02126; H01L 21/02164; H01L 21/0223; H01L 21/02255; H01L 21/02323; H01L 21/02348; H01L 21/3111; H01L 21/76224; H01L 21/76825; H01L 21/76826; H01L 21/76828; H01L 21/76832; H01L 21/823481; H01L 29/0649
USPC ........................................................ 427/240
See application file for complete search history.

(56) References Cited

U.S. PATENT DOCUMENTS

| | | |
|---|---|---|
| 7,790,633 B1 | 9/2010 | Tarafdar et al. |
| 8,889,229 B2 | 11/2014 | Nagahara et al. |
| 8,969,172 B2 | 3/2015 | Nakamoto et al. |
| 9,659,769 B1 | 5/2017 | Varadarajan et al. |
| 10,763,114 B2* | 9/2020 | Kelly ................ H01L 21/28194 |
| 2002/0033535 A1* | 3/2002 | Babich ............. H01L 21/31629 |
| | | 257/E21.264 |
| 2004/0018319 A1 | 1/2004 | Waldfried et al. |
| 2004/0207084 A1 | 10/2004 | Hedrick et al. |
| 2005/0272220 A1 | 12/2005 | Waldfried et al. |
| 2006/0178020 A1 | 8/2006 | Hoshi et al. |
| 2007/0259106 A1 | 11/2007 | Shimizu et al. |
| 2009/0183676 A1 | 7/2009 | Fujii et al. |
| 2010/0148301 A1* | 6/2010 | Matsuda .......... C23C 16/45525 |
| | | 257/E21.546 |
| 2011/0111137 A1 | 5/2011 | Liang et al. |
| 2012/0009413 A1 | 1/2012 | Menezes et al. |
| 2014/0004358 A1 | 1/2014 | Blackwell et al. |
| 2015/0357232 A1 | 12/2015 | Ujihara |
| 2016/0186009 A1 | 6/2016 | Goto |
| 2017/0110577 A1 | 4/2017 | Wang et al. |
| 2017/0316936 A1 | 11/2017 | Wang et al. |
| 2018/0072571 A1 | 3/2018 | Sanchez et al. |
| 2018/0145131 A1* | 5/2018 | Wang ................. H01L 29/7851 |
| 2018/0308842 A1* | 10/2018 | Lee ................. H01L 21/823431 |
| 2018/0350955 A1* | 12/2018 | Chen ................. H01L 29/4958 |
| 2021/0102092 A1 | 4/2021 | Sanchez et al. |

* cited by examiner

CYCLIC SPIN-ON COATING PROCESS FOR FORMING DIELECTRIC MATERIAL

PRIORITY CLAIM AND CROSS-REFERENCE

This application is a continuation of U.S. patent application Ser. No. 17/813,968, filed Jul. 21, 2022, now U.S. Pat. No. 11,791,154 issued Oct. 17, 2023, and entitled "Cyclic Spin-On Coating Process for Forming Dielectric Material," which is a continuation of U.S. patent application Ser. No. 15/992,384, filed May 30, 2018, now U.S. Pat. No. 11,450,526 issued Sep. 20, 2022, and entitled "Cyclic Spin-On Coating Process for Forming Dielectric Material," each application is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs. However, scaling down has also led to challenges that may not have been presented by previous generations at larger geometries. Inaccurate and improper control of the deposition and annealing process during dielectric material fabrication may adversely deteriorate electrical performance of the device structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
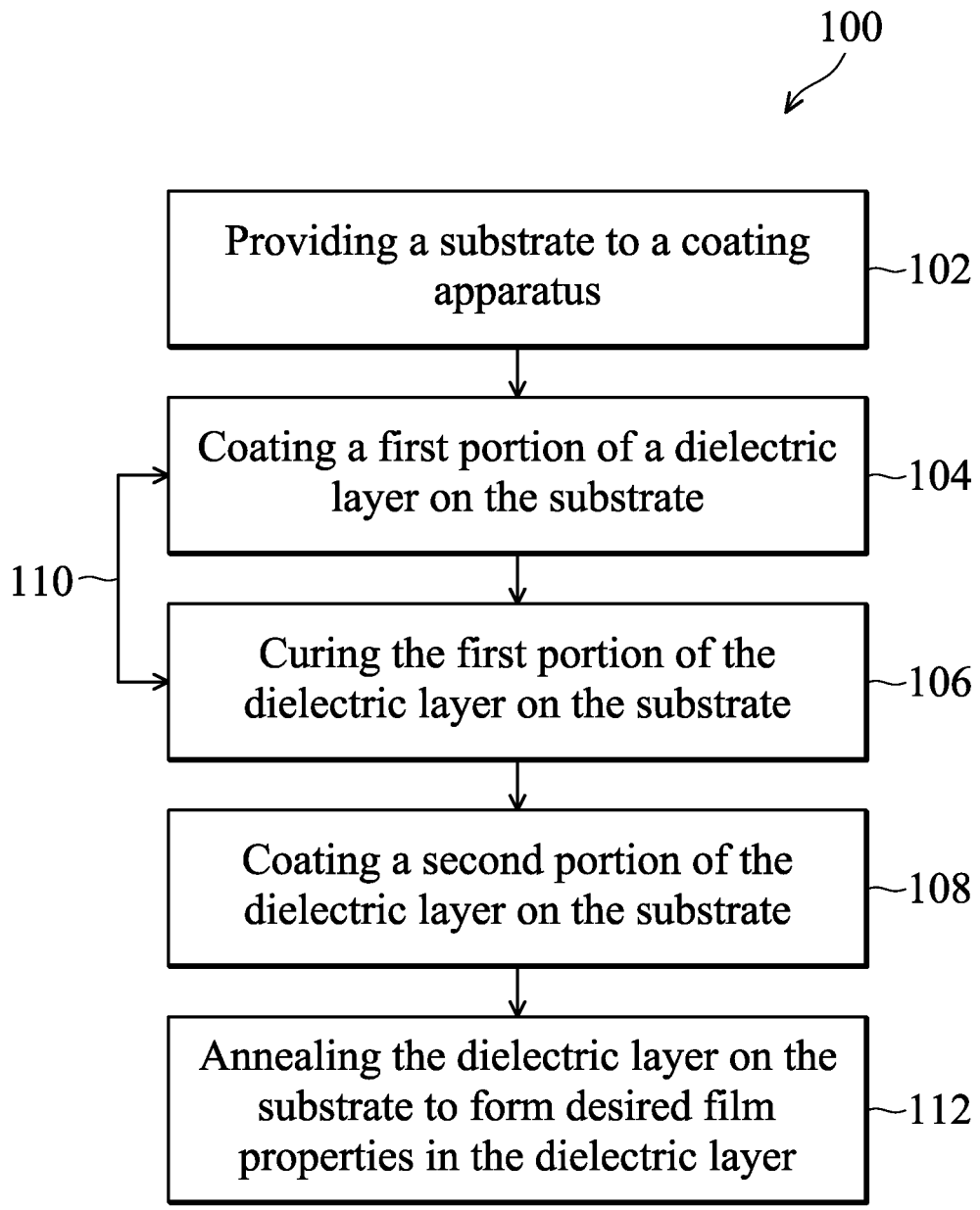
FIG. 1 is a flow chart illustrating an example process for fabricating a dielectric material of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure generally relates to semiconductor devices, and more particularly to a dielectric material formed in semiconductor devices. The present disclosure provides methods for forming a dielectric material by a spin-on coating process. The dielectric material is formed by a cyclic coating process. A portion of the dielectric material is formed by each coating process. A curing process is performed after each coating process to cure the dielectric material. The curing process assists driving out moisture/solvent from the dielectric material. After the cyclic coating and the curing process, an annealing process is performed to densifying the film structure of the dielectric material as well as oxidizing the dielectric material.

Example embodiments described herein are described in the context of forming dielectric material in Front End Of the Line (FEOL). Implementations of some aspects of the present disclosure may be used in other processes. For example, conductive features may be formed in Back End Of the Line (BEOL) processing and/or Middle End Of the Line (MEOL) processing. Some variations of example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein. In some figures, some reference numbers of components or features illustrated therein may be omitted to avoid obscuring other components or features; this is for ease of depicting the figures.

Figure 5A:
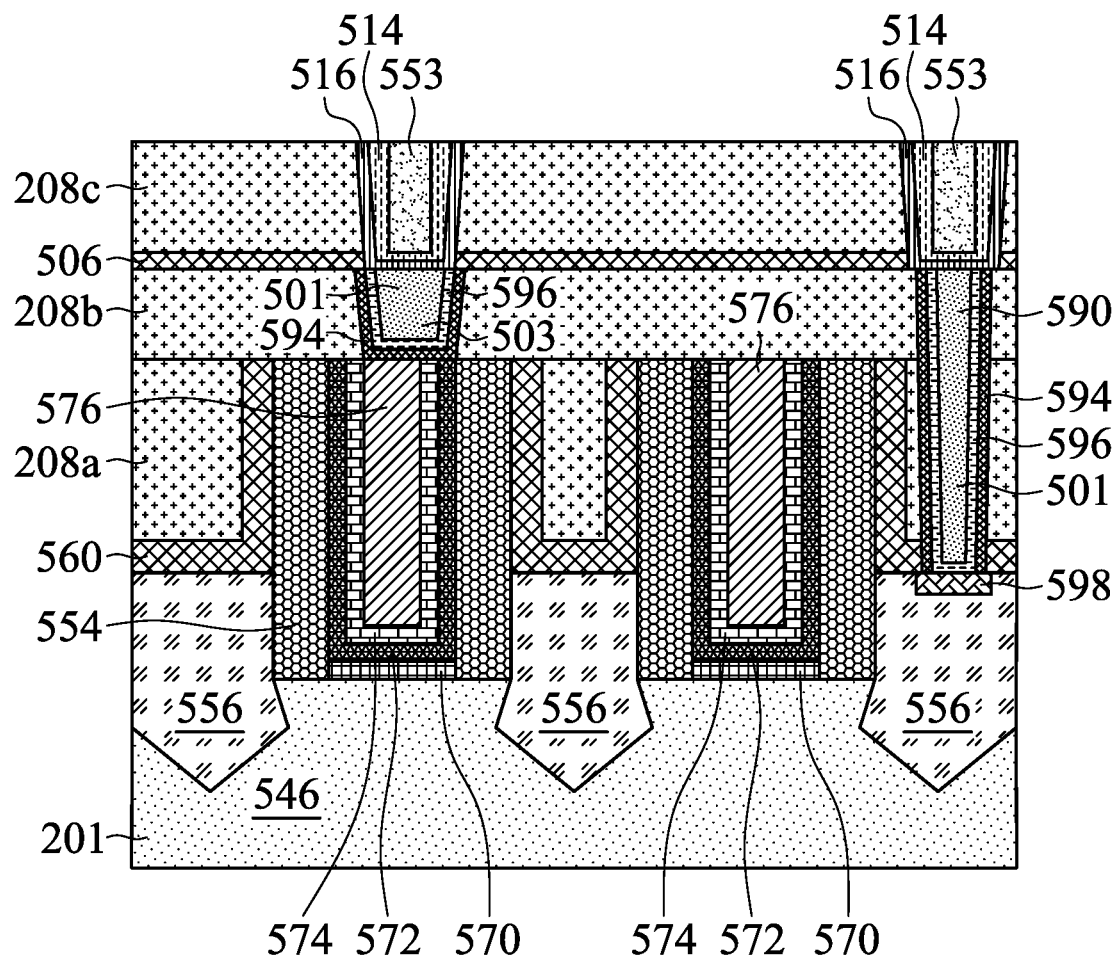
FIGS. 5A and 5B illustrates cross sectional views of a semiconductor device where a dielectric material has been formed by the example process of FIG. 1 in accordance with some embodiments.
Figure 5B:
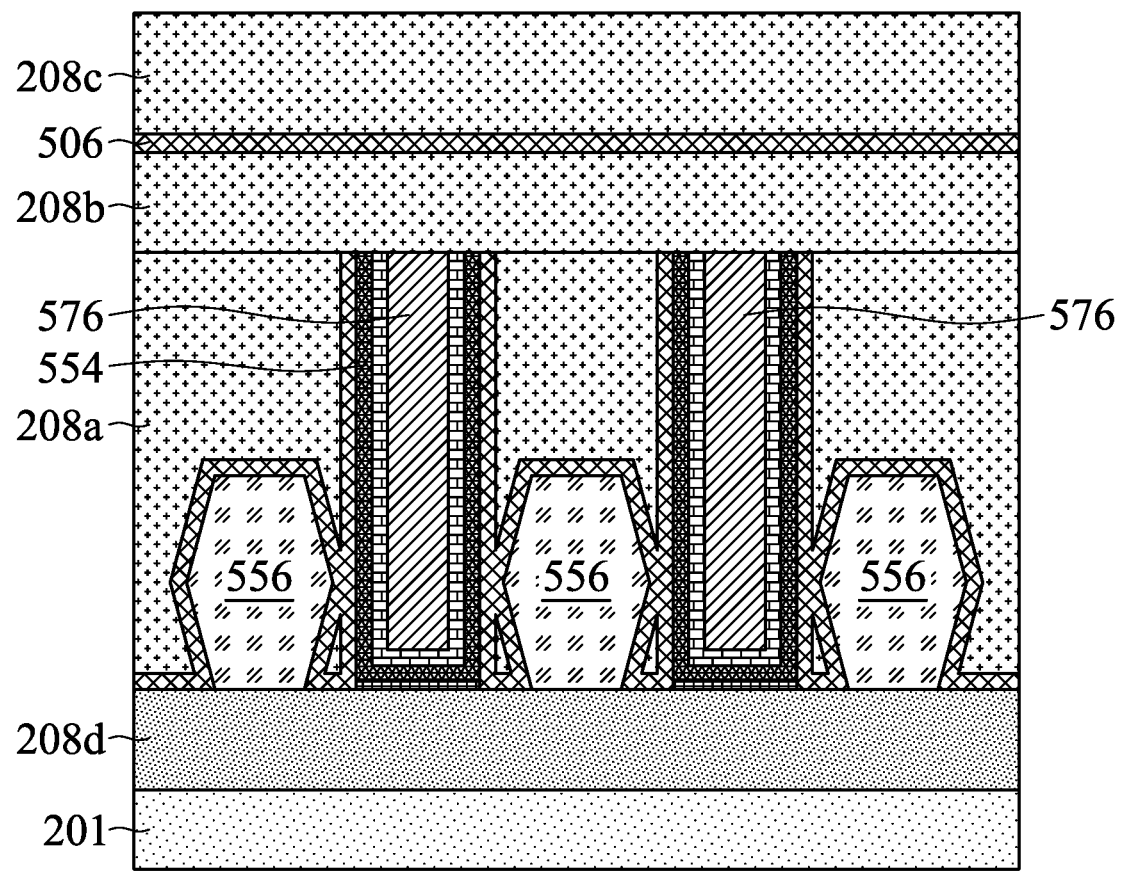

FIG. 1 is a flow chart illustrating an example process 100 for fabricating a dielectric material of a semiconductor device in accordance with some embodiments. FIGS. 2A to 2E illustrate cross-sectional views of the dielectric material at various stages of fabrication according to the flow chart of FIG. 1. Those skilled in the art should recognize that the full process for forming a dielectric material in a semiconductor device and the associated structures are not illustrated in the drawings or described herein, although an example structure is illustrated in FIGS. 5A and 5B.

Figures 2A, 2B, 2C, 2D, 2E:
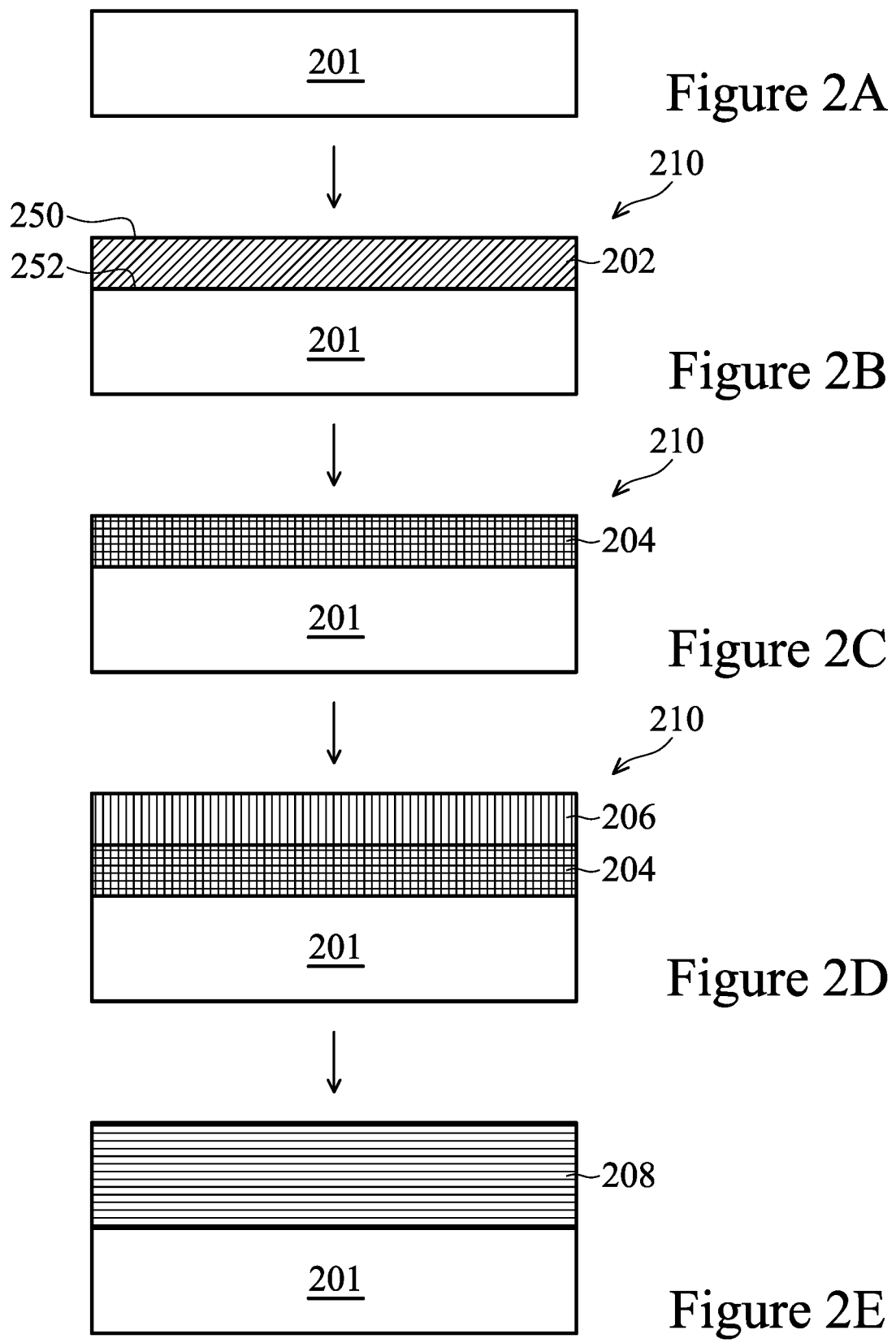
FIGS. 2A to 2E illustrate cross-sectional views of respective intermediate structures during an example process for fabricating a dielectric material in accordance with some embodiments.

The flow chart begins at operation 102 by providing a substrate 201, as shown in FIG. 2A, on which a dielectric material is to be formed by the process 100 of FIG. 1. The substrate 201 is a semiconductor substrate and is or includes a bulk semiconductor substrate (e.g., a wafer), a semiconductor-on-insulator (SOI) substrate, or another substrate. The semiconductor material of the substrate 201 can include or be a material selected from at least one of silicon (e.g., crystalline silicon like Si<100> or Si<111>), silicon germanium, germanium, gallium arsenide, or another semiconductor material. The semiconductor material may be doped or undoped, such as with a p-type or an n-type dopant. In some embodiments wherein a SOI structure is utilized for the substrate 201, the substrate 201 may include semiconductor material disposed on an insulator layer, which may be a buried insulator disposed in a semiconductor substrate, or which may be a glass or sapphire substrate. In embodiments depicted herein, the substrate 201 is a silicon containing material, such as a crystalline silicon substrate. Moreover, the substrate 201 is not limited to any particular size, shape, or materials. The substrate 201 may be a round/circular substrate having a 200 mm diameter, a 300 mm diameter, or other diameters, such as 450 mm, among others. The substrate 201 may also be any polygonal, square, rectangular, curved, or otherwise non-circular workpiece, such as a polygonal substrate as needed.

The substrate 201 may or may not include a structure formed thereon. In some embodiments, the substrate 201 may include a multi-layered structure at various stages of fabrication of an integrated circuit (IC) previously formed on the substrate 201. For example, the structure may include a structure formed during FEOL processing, such as including a shallow trench isolation (STI) structure, a gate structure, a contact structure, and/or other suitable structures. For example, the substrate 201 may include portions of Field Effect Transistors (FETs), such as Fin FETs (FinFETs), planar FETs, vertical gate all around FETs (VGAA FETs), or the like; diodes, capacitors, inductors, and other devices. In some examples, the structure may further include a portion of a structure formed during BEOL processing, wherein individual devices or components are interconnected with, e.g., metal lines, vias, and/or conductive fill materials formed in the dielectric material. It is noted that additional structures, other material layers, or device structures may be formed on the substrate 201 prior to forming the material layer thereon. Various devices may be on the substrate 201.

Figure 3:
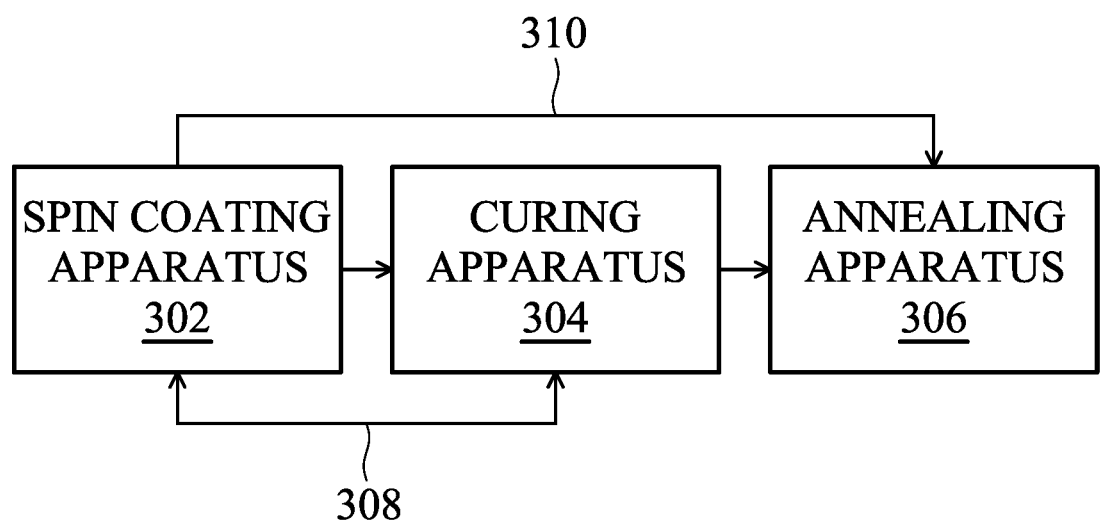
FIG. 3 depicts a flow diagram illustrating an example sequence of transferring a substrate between different apparatus in accordance with some embodiments.

At operation 104, a first coating process is performed to form a first portion 202 of a dielectric material 210 on the substrate 201, as shown in FIG. 2B. The substrate 201 may be transferred to a coating apparatus 302 to perform the coating process, as shown in FIG. 3. The coating process may be a spin-coating process, an inkjet process, a flash evaporator, a spray coating, an aerosol coating, or the like. In some examples, the first coating process is performed by introducing a silicon containing liquid precursor to the surface of the substrate 201. The silicon containing liquid precursor is coated onto the substrate 201 using a spin-on coating process. The spin-on coating process is performed to globally form the first portion 202 of the dielectric material 210 on the surface of the substrate 201, which can include filling trenches, recesses, apertures, voids, gaps, surface discontinuities, and/or steps, if any, formed in the substrate 201. In some examples, the silicon containing liquid precursor includes perhydro-polysilazane (PHPS). The perhydro-polysilazane compound has a chemical formula —$(SiH_2NH)_n$—, wherein n is a positive integer. The perhydro-polysilazane compound contains Si—N bonds as a repeating unit and is a silicon-containing polymer consisting of Si, N, and H. The perhydro-polysilazane compound has a linear structure, chain structure, cross-linked structure, or a cyclic structure in a molecule.

In some examples, the perhydro-polysilazane compound includes a molecular weight at a desired range. For example, the perhydro-polysilazane compound may have an average molecular weight greater than about 300 g/mol, such as in a range from about 5000 g/mol to about 8000 g/mol. The perhydro-polysilazane compound with such molecular weight range provides enough Si ratio when forming the dielectric layer on the substrate so as to provide a better film quality after the subsequent annealing process.

The perhydro-polysilazane compound is often provided in a solution, wherein the solution comprises about 5 to about 50 percent by weight of perhydro-polysilazane, and about 30 percent to about 95 percent by weight of a solvent. Suitable solvents include xylene, dibutyl ether, trihydroxy benzene, ethylene glycol, toluene, pyridine, hexane, or the like.

As the perhydro-polysilazane compound includes silicon-containing polymer consisting of Si, N, and H, the first portion 202 of the dielectric material 210 formed on the substrate 201 is a silicon and nitrogen containing material and is later converted into a silicon and oxygen containing material by oxidation during a thermal treating process at operation 112.

In some embodiments, the perhydro-polysilazane compound may be coated onto the substrate 201 to form the first portion 202 of the dielectric material 210 with a thickness in a range from about 50 nm to about 250 nm, such as from about 70 nm to about 150 nm, for example about 100 nm.

The coating process is performed at a temperature in a range from about 5 degrees Celsius to about 80 degrees Celsius, such as from about 10 degrees Celsius to about 30 degrees Celsius, such as about room temperature or such as about 25 degrees Celsius.

In operation 106, after the first portion 202 of the dielectric material 210 is coated onto the substrate 201, the first portion 202 of the dielectric material 210 is cured. The substrate 201, with the first portion 202 thereon, is transferred to a curing apparatus 304 from the coating apparatus 302, as shown in FIG. 3, to perform the curing process. The curing process removes moisture/solvent from the first portion 202 of the dielectric material 210 so as to form a first solid phase portion 204 of the dielectric material 210, as shown in FIG. 2C. As the first portion 202 of the dielectric material 210 is cured, moisture and solvent in the first portion 202 of the dielectric material 210 are driven out, forming the first solid phase portion 204 of the dielectric material 210. In some embodiments, the curing apparatus 304 (wherein the curing process at operation 104 may be executed) includes a hot plate, an oven, a heated chamber, or suitable tools. A UV light source may provide radiation, generating heat energy to evaporate, decompose, or "burn out" the moisture or solvent from the first portion 202 of the dielectric material 210. The thermal energy provided from the UV radiation provides heat energy to decompose the first portion 202 of the dielectric material 210, forming volatile by-products in gas phase that are easily pumped out and removed from the curing apparatus 304.

In some embodiments, the curing process is a UV thermal curing process and is performed by exposing the substrate under a UV thermal energy with or without a curing gas. In embodiments wherein the curing gas is utilized during the UV thermal curing process, the curing gas may be in the form of a gas or a vaporized liquid vapor that may assist reacting with and removing the moisture and/or solvent from the first portion 202 of the dielectric material 210. The UV thermal curing process is performed with the UV light source unit turned on in the curing apparatus 304, such as UV lamps in the curing apparatus 304, to assist dissociation and decomposition of chemical bonds to remove moisture and/or solvent from the first portion 202 of the dielectric material 210. The UV light source unit may be turned on prior to, while, or after flowing the curing gas into the curing apparatus 304, when a curing gas is used.

The UV thermal energy provided from the UV radiation may efficiently evaporate the moisture and/or solvent from the first portion 202 of the dielectric material 210 into gas or vapor phase, which may be easily removed from the substrate surface and pumped out of the curing apparatus 304. As the solvent in the first portion 202 often has a relatively lower evaporating point, such as less than 150 degrees Celsius, by utilizing a UV thermal energy from the UV radiation may evaporate the solvent and promote continuing decomposition of the perhydro-polysilazane compound in the first portion 202 of the dielectric material 210. In some embodiments, the wavelength of radiation from the UV light source may be selected to activate particular energy modes so as to assist decomposing the perhydro-polysilazane compound in the first portion 202 as well as driving out the moisture and the solvent. Further, the UV light power level is also controlled at a relatively lower range so as to ensure that the thermal energy provided from the UV light is uniformly propagated through the bulk thickness of the first portion 202 of the dielectric material 210. It is believed that slow thermal curing process assists a relatively thorough decomposing process of the polymer perhydro-polysilazane compound. As a result, the bonds of the Si—N and Si—H across the first portion 202 are decomposed to form a silicon nitride containing material of the first portion 202 with relatively strong bonding across the first portion 202. A uniform bonding structure of the first portion 202 assists oxygen to be bonded into the structure in the oxidation process performed subsequently. Thus, the silicon nitride containing material of the dielectric material 210 can be efficiently and uniformly converted into a silicon and oxygen containing material across the bulk structure of the dielectric material 210.

In some examples, the UV light has a wavelength in a range from about 100 nm to about 300 nm. The UV light may be a broad spectrum UV light or may have a single wavelength. The processing time for the UV thermal curing process may be in a range from about 15 seconds to about 900 seconds, for example about 60 seconds. During the thermal curing process, the substrate temperature is heated to a temperature in a range from about to about 400° C., for example from about 200° C. to about 350° C., such as about 300° C. The substrate temperature is heated by controlled a temperature setting at a substrate support stage on which the substrate is disposed during the curing process. The UV power may be in a range from about 500 mJ/cm 2 to about 6000 mJ/cm$^2$, for example about 2500 mJ/cm$^2$. During the process, the chamber pressure may be in a range from about 5 milliTorr to about 200 Torr, for example about 80 Torr. In some particular embodiments, the UV light source provides a radiation having a wavelength of about 200 nm to remove the moisture/solvent from the first portion 202 of the dielectric material 210 on the substrate 201. The UV power is controlled at about 4000 mJ/cm$^2$.

Maintaining a desired range of the thickness of the first portion 202 of the dielectric material 210 may promote a relatively uniform thermal curing process. Overly thick thickness of the first portion 202 of the dielectric material 210, such as greater than 200 nm, may influence the propagation or transmission of the thermal energy across the first portion 202. Thus, a thermal gradient may be found between an upper surface 250 and a lower surface 252 of the first portion 202, resulting in non-uniform film properties and bonding structures, which may eventually lead to poor device performance. Non-uniform film properties often result in poor film quality control and non-equal wet etching rates across the dielectric material 210, which can result in undesired poor device performance control. Thus, the first portion 202 of the dielectric material 210 is controlled to have a thickness less than 200 nm, such as in a range from about 100 nm to about 150 nm. As a result, the thermal energy from the thermal curing process can be slowly and uniformly transmitted across the first portion 202 of the dielectric material 210, driving out the solvent and moisture, forming the first solid phase portion 204.

At operation 108, a second coating process is performed to form a second portion 206 of the dielectric material 210 on the substrate 201, as shown in FIG. 2D. In this operation, the substrate 201 may be transferred back to the coating apparatus 302 to perform the coating process, as shown in FIG. 3, as indicated by the loop 308. The coating process at operation 108 is similar to the coating process at operation 104. Thus, the coating process is also a spin-coating process. In some examples, the second coating process is performed by introducing the silicon containing liquid precursor to the surface of the substrate 201. As discussed above, the silicon containing liquid precursor includes perhydro-polysilazane (PHPS). The perhydro-polysilazane compound has a chemical formula —(SiH$_2$NH)$_n$—, wherein n is a positive integer. The perhydro-polysilazane compound contains Si—N bonds as a repeating unit and is a silicon-containing polymer consisting of Si, N, and H. The perhydro-polysilazane compound has a linear structure, chain structure, cross-linked structure, or a cyclic structure in a molecule.

In some examples, the perhydro-polysilazane compound includes a molecular weight at a desired range. For example, the perhydro-polysilazane compound may have an average molecular weight greater than about 300 g/mol, such as in a range from about 5000 g/mol to about 8000 g/mol.

The perhydro-polysilazane compound is often provided in a solution, wherein the solution comprises about 5 to about 50 percent by weight of perhydro-polysilazane, and about 30 percent to about 95 percent by weight of a solvent. Suitable solvents include xylene, dibutyl ether, trihydroxy benzene, ethylene glycol, toluene, pyridine, hexane, or the like. As the perhydro-polysilazane compound includes silicon-containing polymer consisting of Si, N, and H, the second portion 206 of the dielectric material 210 formed on the substrate 201 is a silicon and nitrogen containing material and is later converted into a silicon and oxygen containing material by a thermal annealing process.

In some embodiments, the perhydro-polysilazane compound may be coated onto the substrate 201 to form the second portion 206 of the dielectric material 210 with a thickness in a range from about 50 nm to about 250 nm, such as from about 70 nm to about 150 nm, for example about 100 nm.

At operation 112, after the second portion 206 of the dielectric material 210 is formed on the substrate 201, a thermal annealing process is performed to transform the dielectric material 210, including the first solid phase portion 204 and the second portion 206, into an annealed dielectric material 208, as shown in FIG. 2E. The thermal energy provided from the thermal annealing process may densify and enhance the bonding structures of dielectric material 210. As thermal annealing process at operation 112 is performed after the spin-coating of the second portion 206, the curing process at operation 106 utilized to cure the first portion 202 may be omitted as the second portion 206 is in direct exposure with the thermal energy provided from the thermal annealing process at operation 112.

During the thermal annealing process, an annealing gas comprising at least one oxygen containing gas is supplied. The oxygen from the oxygen containing gas reacts with the silicon atoms from the polysilazane compound, converting the silicon nitride containing layer into silicon oxide. The thermal energy provided from the thermal annealing process breaks the Si—N bonds, allowing the oxygen atoms to be bonded and attached to the silicon atoms, forming the annealed dielectric material 208 to be silicon oxide. Thus, the temperature during the thermal annealing process is often pre-determined so as to provide thermal energy by the thermal annealing process sufficient to convert the Si—N bonds from polysilazane into Si—O bonds, forming the desired silicon oxide material.

In some embodiments, the thermal annealing process may be performed in an annealing apparatus 306, as shown in FIG. 3. After the second portion 206 of the dielectric material 210 is formed in the coating apparatus 302, the substrate 201 may then be transferred to the annealing apparatus 306, as indicated by the arrow 310, for thermal annealing process. During annealing, an annealing gas is supplied. Gases that may be supplied in the annealing gas mixture may include an oxygen containing gas, such as $O_2$, $O_3$, $N_2O$, steam ($H_2O$), $H_2O_2$, air, $CO_2$, CO, the like, or a combination thereof. In some examples, the annealing gas mixture may include steam ($H_2O$), air, or $O_2$. During the process, the process temperature may be greater than about 350 degrees Celsius, such as in a range from about 400 degrees Celsius to about 1200 degrees Celsius, such as about 600 degrees Celsius.

In some embodiments, the duration of the thermal annealing process is in a range from about 10 minutes to about 600 minutes, for example, from about 60 minutes to about 180 minutes, such as about 120 minutes. The chamber may have a pressure in a range from about 0.1 Torr to about 100 Torr, for example, from about 0.1 to about 50 Torr, such as 0.5 Torr.

The thermal annealed process performed at operation 112 may assist converting the dielectric material 210 into a silicon oxide material as well as densifying the film structures of the annealed dielectric material 208. Thus, stronger bonding structures and silicon oxygen bonds in the resultant annealed dielectric material 208 may be formed. Furthermore, the thermal annealing process may also assist in breaking Si—N bonds and driving out the dangling bonds or weak silicon-hydrogen bonds from the annealed dielectric material 208. This may provide a densified film structure and may improve film quality. Additionally, the thickness of the annealed dielectric material 208 can increase by an amount in a range from about 10 percent to about 30 percent due to the thermal expansion during the thermal annealing process, as compared to the dielectric material 210 without thermal annealing.

As discussed above, the solvent and/or moisture from the first portion 202 of the dielectric material 210 has been previously driven out, the oxygen elements from the annealing gas during the thermal annealing process can then efficiently penetrate down through the overall thickness of the dielectric material 210 (e.g., down to the first portion 202 of the dielectric material 210), thus enabling a conversion of the silicon nitride containing material to a silicon oxide material both in the first solid phase portion 204 and second portion 206 of the dielectric material 210.

In some embodiments, the annealed dielectric material 208 has a thickness in a range from about 300 nm to about 450 nm. As discussed above, each coating, such as the first and the second portion 202, 206, of the dielectric material 210 is controlled to have a thickness in a range from about 50 nm to about 250 nm. By doing so, an oxidation conversion process during the thermal annealing process is obtained in some examples. In contrast, in the situation wherein the annealed dielectric material 208 is desired to have a thicker thickness, such as greater than the thickness that two coatings (e.g., the first and the second coating at operation 104, 108 of the first and second portions 202, 206) can provide, the operations 104, 106 may be repeatedly performed, as indicated by the loop 110, as shown in FIG. 1, to coat more than two portions of the dielectric material 210 prior to performing the thermal annealing process at operation 112.

Figure 4A:
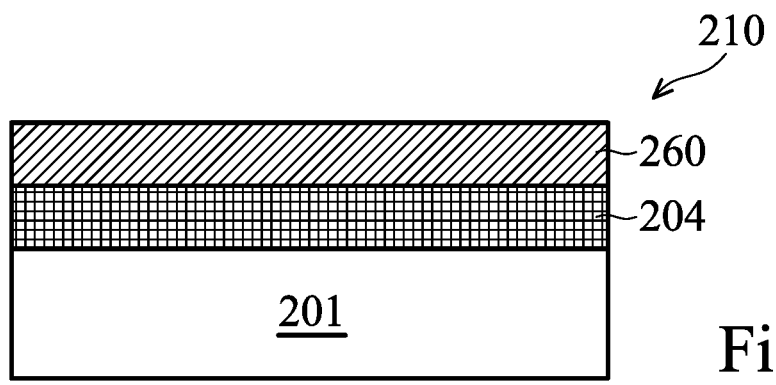
FIGS. 4A to 4D illustrate cross-sectional views of respective intermediate structures during an example process for fabricating a dielectric material in accordance with some embodiments.
Figure 4B:
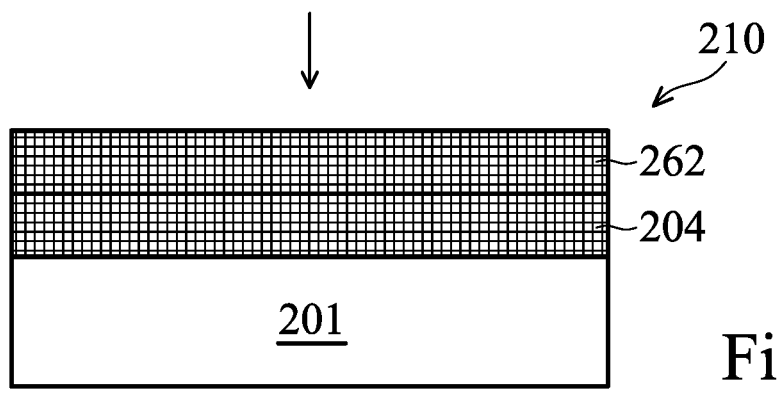
Figure 4C:
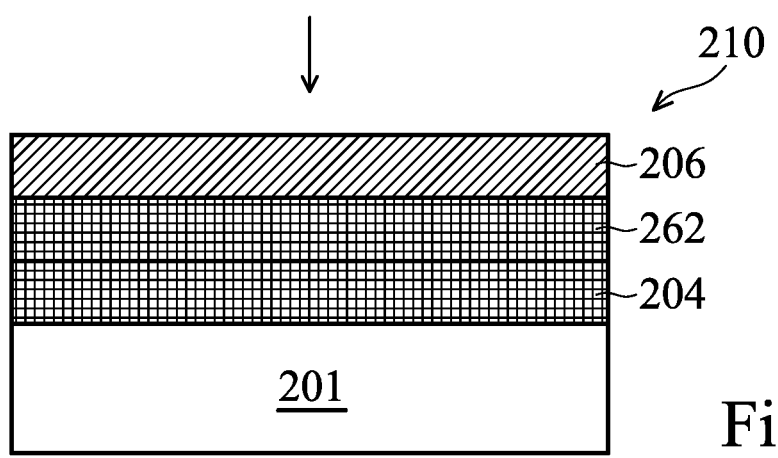
Figure 4D:
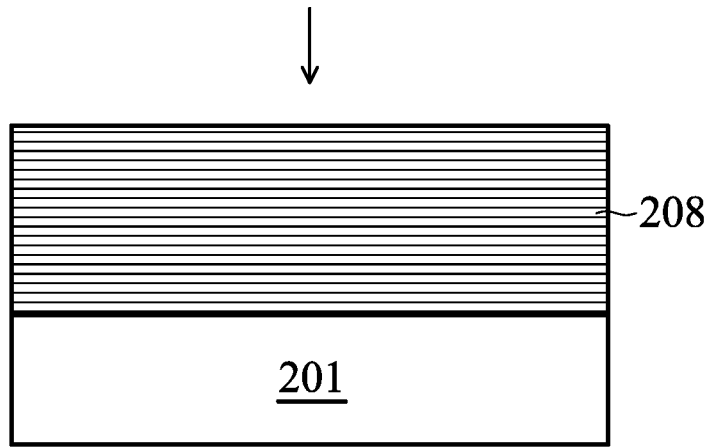

For example, when a thickness of the annealed dielectric material 208 is desired to have a thickness greater than about 400 nm, after the first portion 202 of the dielectric material 210 is cured to form the first solid phase portion 204, an additional coating process similar to the operation 104 is performed. The additional coating process coats an additional portion 260 of the dielectric material 210 on the first solid phase portion 204, as shown in FIG. 4A. The additional portion 260 of the dielectric material 210 is similar to the first portion 202 having a silicon and nitrogen containing material formed by the coating of the perhydro-polysilazane compound. Similarly, after the coating process at operation 104, a curing process at operation 106 is then performed again to cure the additional portion 260, converting the additional portion 260 into a second solid phase portion 262, as shown in FIG. 4C.

It is noted that the cycle of the operations 104 and 106 may be performed as many times as needed to form multiple portions of the dielectric material 210 until the final portion (e.g. the second portion 206) of the dielectric material 210 is formed. Repeated coating and curing processes between the operations 104 and 106 assist forming small portions of the dielectric material 210 with individual corresponding curing process, thus providing film structures with minimum solvent and moisture remaining in the dielectric material 210 prior to the thermal annealing process at operation 112. Thus, when the thermal annealing process at operation 112 is performed, the thermal energy as provided can then be successfully transmitted and propagated through the whole body of the dielectric material 210, forming the annealed dielectric material 208 with the desired conversion from silicon nitride containing material to silicon oxide containing material with minimum or without nitrogen content remaining. It is noted that in some examples, a minimum nitrogen content may remain in the annealed dielectric material 208. In such example, the nitrogen content can be less than about 5 atomic percent, such as in a range from about 0.005 to about 5% in atomic percent, may be detected in the annealed dielectric material 208 after the thermal annealing process at operation 112.

FIG. 5A depicts a cross-sectional view of an example semiconductor device where the annealed dielectric material 208 formed from the process of FIG. 1 may be utilized. In the example depicted in FIG. 5A, the annealed dielectric material 208 (shown as 208a, 208b, 208c) may be utilized as each of a first interlayer dielectric (ILD) 208a, a second ILD 208b, and an intermetal dielectric (IMD) 208c.

The substrate 201 includes fin structures 546 formed on the upper portion of the substrate 201. Epitaxy source/drain regions 556 are formed in the fin structure 546. Gate structures are formed on the fin structure 546. Each gate structure includes an interfacial dielectric 570, a gate dielectric layer 572, one or more optional conformal layers 574, and a gate conductive fill material 576. Gate spacers 554 are formed along sidewalls of the gate structures. The interfacial dielectric 570 is along surfaces of the fin structure 546 between respective gate spacers 554. The gate dielectric layer 572 is conformally on the interfacial dielectric 570 and along sidewalls of and between respective gate spacers 554. The one or more optional conformal layers 574 are conformally on the gate dielectric layer 572 and can include one or more barrier and/or capping layers and one or more workfunction tuning layers. The gate conductive fill material 576 is on the one or more optional conformal layers 574. A contact etch stop layer (CESL) 560 is conformally on surfaces of the epitaxy source/drain regions 556, and sidewalls of gate spacers 554.

The first ILD 208a is over the CESL 560. The first ILD 208a may be formed by the process 100 depicted in FIG. 1 and shown in FIGS. 2A-2E or 4A-4D where the CESL 560 and gate spacers 554 are formed therein. In some examples, a dummy gate structure is disposed between the gate spacers 554 when the first ILD 208a is formed, and after the first ILD 208a is formed (e.g., by the process 100 depicted in FIG. 1), the dummy gate structure is replaced with the gate structure illustrated in FIG. 5A. Thereafter, the second ILD 208b is formed on the gate structures and the first ILD 208a. The second ILD 208b may be formed by the process 100 depicted in FIG. 1 and shown in FIGS. 2A-2E or 4A-4D. Conductive features 503, 590 are formed through the first and/or second ILD 208a, 208b to electrically connect to the gate structure and the epitaxy source/drain region 556, respectively. The conductive feature 590 includes, in the illustrated example, an adhesion layer 594, a barrier layer 596 on the adhesion layer 594, a silicide region 598 on the epitaxy source/drain region 556, and conductive fill material 501 on the barrier layer 596, for example. The conductive feature 503 includes, in the illustrated example, an adhesion layer 594, a barrier layer 596 on the adhesion layer 594, and conductive fill material 501 on the barrier layer 596, for example.

An etch stop layer 506 is formed on the second ILD 208b and the conductive features 590, 503. The IMD 208c is formed on the etch stop layer 506. The IMD 208c may be formed by the process 100 depicted in FIG. 1 and shown in FIGS. 2A-2E or 4A-4D. Conductive features (including barrier layer 514, liner layer 516 on the barrier layer 514, and conductive fill material 553 on the liner layer 516) are formed through the IMD 208c and the etch stop layer 506 and electrically connect to the conductive features 590, 503.

The annealed dielectric material 208 (shown as 208a, 208b, 208c in FIG. 5A) formed by the process 100 depicted in FIG. 1 is implemented, in some examples, to form the first ILD 208a, the second ILD 208b, and the IMD 208c. As the perhydro-polysilazane compound utilized at operation 104 is a liquid/solution based compound, the perhydro-polysilazane compound can fill the trenches, recesses, apertures, voids, gaps, surface discontinuities, and/or steps on the substrate 201.

Furthermore, FIG. 5B depict another cross sectional view of the semiconductor device of FIG. 5A with the shallow trench isolation 208d formed on the substrate 201. The cross sectional view of FIG. 5B is parallel to the cross sectional view of FIG. 5A and is between neighboring fin structures 546 formed on the substrate 201. The shallow trench isolation 208d may be formed from the annealed dielectric material 208 depicted above with reference to FIG. 1 and FIGS. 2A-2E and/or 4A-4D. As the shallow trench isolation 208d is in a trench, the liquid/solution based compound including the perhydro-polysilazane compound can fill the trenches between fin structures 546 on the substrate 201 with desired gap filling capabilities so as to form the shallow trench isolation 208d with desired profile and film properties. FIG. 5B illustrates the epitaxy source/drain regions 556 in a cross section where the epitaxy source/drain regions 556 may be merged between neighboring fin structures 546. In other examples, the epitaxy source/drain regions 556 may not be present in a similar cross section because the epitaxy source/drain regions 556 are not merged between neighboring fin structures 546.

Figure 6:
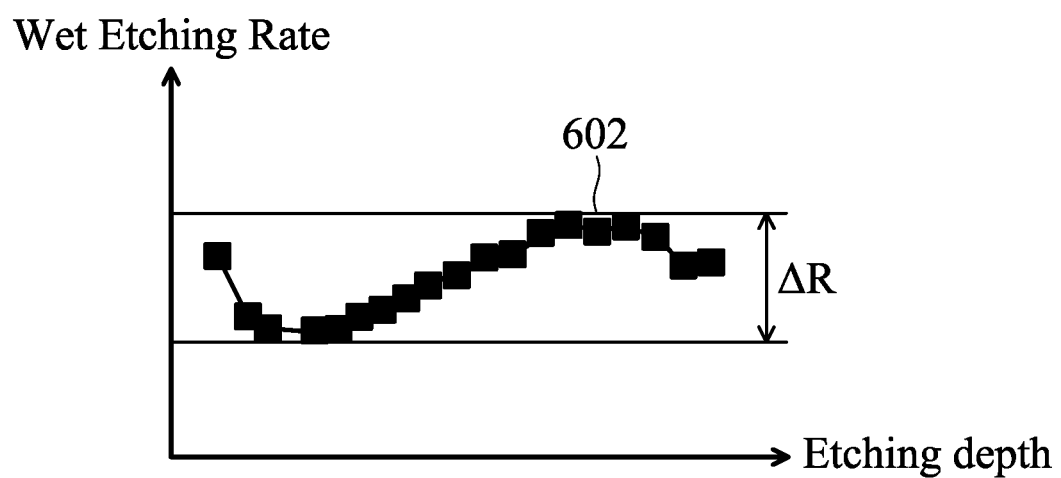
FIG. 6 illustrates a wet etching rate trace line of a dielectric material where the dielectric material has been formed by the example process of FIG. 1 in accordance with some embodiments.

FIG. 6 illustrates a wet etching rate trace line 602 of the annealed dielectric material 208. The wet etching rate trace line 602 is plotted as a function of thickness etched away from the annealed dielectric material 208 (e.g., the etching depth). The wet etching rate trace line 602 indicates that the film properties of the annealed dielectric material 208 are generally similar and uniform so that, under the wet etching process, the annealed dielectric material 208 is being etched away at a relatively equal and/or steady etching rate with an etching rate deviation ($\Delta R$) less than 20 Å per minute.

Implementations of the present disclosure provide methods for forming a dielectric material by a multiple spin-on coating process (e.g., a cyclic spin-on coating process) followed by a thermal annealing process. After at least one spin-on coating process and a UV thermal curing process, a second spin-on coating process is performed followed by a thermal annealing process. By implementing multiple spin-on coating processes prior to performing a thermal annealing process to form the dielectric material, the solvent and moisture from the spin-on coating layer can be efficiently driven out, enabling a through oxidation process at the following thermal annealing process. As a result, an annealed dielectric material having a silicon oxide material having a nitrogen content less than 5 atomic percent can be obtained.

In an embodiment, a method of semiconductor processing includes spin-coating a first portion of a dielectric material on a substrate, curing the first portion of the dielectric material on the substrate, spin-coating a second portion of the dielectric material on the substrate, and thermal annealing the dielectric material to form an annealed dielectric material on the substrate.

In another embodiment, a method of semiconductor processing includes spin-coating a first solution including a perhydro-polysilazane compound on a substrate, curing the first solution to form a cured first portion of a dielectric material on the substrate, spin-coating a second solution including a perhydro-polysilazane compound on the cured first portion of the dielectric material on the substrate to form a second portion of the dielectric material on the substrate, and annealing the cured first portion and the second portion of the dielectric material.

In yet another embodiment, a structure includes an active area and a shallow trench isolation on a substrate, a gate structure over the active area, a first dielectric material over the active area and the shallow trench isolation and disposed laterally from the gate structure, and a second dielectric material over the gate structure and the first dielectric material. The shallow trench isolation abuts the active area. A source/drain region is in the active area proximate the gate structure. At least one of the first dielectric material, the second dielectric material, and the shallow trench isolation includes a silicon oxide material having a nitrogen content in a range from about 0.005 atomic percent to about 0.5 atomic percent.

The foregoing outlines features of several embodiments so that those skilled in the art may better understand the aspects of the present disclosure. Those skilled in the aft should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor processing, the method comprising:
   spin-coating a first portion of a dielectric material on to a non-planar substrate;
   curing the first portion of the dielectric material to decompose Si—N and Si—H bonds in the first portion of the dielectric material to form a first silicon nitride;
   spin-coating a second portion of the dielectric material on the first portion of the dielectric material, wherein the second portion comprises a second silicon nitride; and
   thermal annealing the dielectric material to form an annealed dielectric material on the substrate, wherein the thermal annealing the dielectric material converts the first silicon nitride and the second silicon nitride into a silicon oxide material and increases a thickness of the dielectric material.

2. The method of claim 1, wherein the spin-coating the first portion of the dielectric material onto the non-planar substrate fills surface discontinuities in the non-planar substrate.

3. The method of claim 1, wherein the curing the first portion of the dielectric material comprises providing a UV energy to the first portion of the dielectric material.

4. The method of claim 3, wherein the providing the UV energy further comprises controlling a substrate temperature of the non-planar substrate in a range of 50° C. to 400° C.

5. The method of claim 1, wherein the thermal annealing the dielectric material further comprises supplying an oxygen containing gas to the dielectric material during the thermal annealing of the dielectric material.

6. The method of claim 5, wherein the thermal annealing the dielectric material further comprises controlling a substrate temperature of the non-planar substrate in a range of 400° C. to 1200° C.

7. The method of claim 1, wherein the spin-coating the first portion of the dielectric material further comprises:
   spin-coating a first solution onto the non-planar substrate, wherein the first solution comprises a perhydro-polysilazane compound and a solvent and wherein the curing the first portion of the dielectric material drives out the solvent from the first solution.

8. A method of semiconductor processing, the method comprising
   curing a first solution to form a cured first portion in a curing apparatus, wherein the cured first portion is silicon nitride;
   spin-coating a second solution on to the cured first portion in a coating apparatus;
   curing the second solution to form a cured second portion in the curing apparatus, wherein the cured second portion is silicon nitride; and
   annealing the cured first portion and the cured second portion to form an annealed dielectric material in an annealing apparatus, wherein the annealed dielectric material is silicon oxide, wherein a first thickness of the cured first portion and the cured second portion before the annealing the cured first portion and the cured second portion is less than a second thickness of the annealed dielectric material.

9. The method of claim 8, wherein the annealed dielectric material is a shallow trench isolation.

10. The method of claim 8, wherein the first solution comprises a perhydro-polysilazane compound having an average molecular weight in a range of 5000 g/mol to about 8000 g/mol.

11. The method of claim 10, wherein the first solution comprises 5 to 30 percent by weight of the perhydro-polysilazane compound.

12. The method of claim 8, wherein the curing the second solution comprises exposing the second solution to a UV energy.

13. The method of claim 8, wherein the annealing the cured first portion comprises supplying an oxygen-containing gas in the annealing apparatus.

14. The method of claim 8, wherein the annealing the cured first portion comprises controlling a substrate temperature of a non-planar substrate in a range of 400° C. to 1200° C.

15. The method of claim 8, wherein a nitrogen concentration of the annealed dielectric material is less than 5 atomic percent.

16. A method of semiconductor processing, the method comprising:
   curing a first portion of a first solution to form a first moisture-free portion of a dielectric material;
   spin-coating a second portion of the first solution on the first moisture-free portion of the dielectric material; and
   annealing the second portion of the first solution and the first moisture-free portion of the dielectric material to form a dielectric layer, wherein the annealing converts both the second portion of the first solution and the first moisture-free portion of the dielectric material from a non-oxide into an oxide, wherein the first moisture-free portion of the dielectric material and the second portion of the first solution have a first thickness before the annealing and the dielectric layer has a second thickness after the annealing, wherein the second thickness is greater than the first thickness.

17. The method of claim 16, wherein the curing the first portion of the first solution comprises exposing the first portion of the first solution to a UV light having a wavelength in a range of 100 nm to 300 nm.

18. The method of claim 16, wherein the curing the first portion of the first solution comprises exposing the first portion of the first solution to a UV light having a UV power in a range of 500 mJ/cm$^2$ to about 6000 mJ/cm$^2$.

19. The method of claim 16, further comprising curing the second portion of the first solution by providing a UV energy to the second portion, wherein the UV energy decomposes Si—N and Si—H bonds in the second portion to form silicon nitride before the annealing.

20. The method of claim 16, wherein the dielectric layer comprises a silicon oxide material having a nitrogen content in a range from about 0.005 atomic percent to about 0.5 atomic percent.

* * * * *